(12) United States Patent
Aoyagi et al.

(10) Patent No.: US 9,984,956 B2
(45) Date of Patent: May 29, 2018

(54) THROUGH ELECTRODE, MANUFACTURING METHOD THEREOF, AND SEMICONDUCTOR DEVICE AND MANUFACTURING METHOD THEREOF

(71) Applicant: National Institute of Advanced Industrial Science and Technology, Tokyo (JP)

(72) Inventors: Masahiro Aoyagi, Tsukuba (JP); Tung Thanh Bui, Tsukuba (JP); Naoya Watanabe, Tsukuba (JP); Fumiki Kato, Tsukuba (JP); Katsuya Kikuchi, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days. days.

(21) Appl. No.: 14/929,060

(22) Filed: Oct. 30, 2015

(65) Prior Publication Data

US 2016/0322282 A1 Nov. 3, 2016

(30) Foreign Application Priority Data

Apr. 30, 2015 (JP) ................................. 2015-093196

(51) Int. Cl.
*H01L 23/48* (2006.01)
*H01L 23/532* (2006.01)
(Continued)

(52) U.S. Cl.
CPC ...... *H01L 23/481* (2013.01); *H01L 21/76831* (2013.01); *H01L 21/76898* (2013.01);
(Continued)

(58) Field of Classification Search
USPC .......................................... 257/741; 438/667
See application file for complete search history.

(56) References Cited

U.S. PATENT DOCUMENTS

| 9,041,163 B2* | 5/2015 | Chen ................. H01L 21/76898 257/621 |
| 2007/0148416 A1* | 6/2007 | Wolkin ................ G01K 17/006 428/195.1 |

(Continued)

OTHER PUBLICATIONS

Fabrication and Electrical Characterization of Parylene-HT Liner Bottom-up Copper Filled Through Silicon Via (TSV), Bui Thanh Tung, Xiaojin Cheng, Naoya Watanabe, Fumiki Kato,, Katsuya Kikuchi, and Masahiro Aoyagi, Nanoelectronics Research Institute (NeRI) National Institute of Advanced Industrial Science and Technology (AIST), Nov. 2014.*

(Continued)

*Primary Examiner* — Marcos D Pizarro
*Assistant Examiner* — Lawrence Tynes, Jr.
(74) *Attorney, Agent, or Firm* — Peter Su; Dentons US LLP

(57) ABSTRACT

Provided are a through electrode including an organic side-wall insulating film, capable of eliminating a barrier layer and achieving satisfactory mechanical reliability and electrical reliability and a manufacturing method thereof, and a semiconductor device and a manufacturing method thereof. According to one aspect of the present invention, a through electrode disposed in a semiconductor substrate is provided, including: a copper layer in the semiconductor substrate; and a side-wall insulating film that is disposed between the copper layer and the semiconductor substrate so as to be in contact with the copper layer and the semiconductor substrate, the side-wall insulating film being represented by the following chemical formula (1).

[Formula 1]

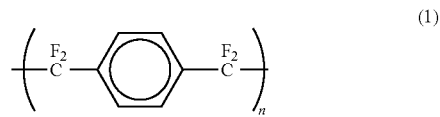

(1)

11 Claims, 14 Drawing Sheets

(51) Int. Cl.
*H01L 21/768* (2006.01)
*H01L 21/02* (2006.01)
*H01L 21/288* (2006.01)

(52) U.S. Cl.
CPC .............. *H01L 23/53228* (2013.01); *H01L 2224/16145* (2013.01); *H01L 2224/16225* (2013.01); *H01L 2924/15311* (2013.01)

(56) References Cited

U.S. PATENT DOCUMENTS

| | | | |
|---|---|---|---|
| 2011/0207323 A1* | 8/2011 | Ditizio | B81C 1/00087 438/675 |
| 2012/0013022 A1* | 1/2012 | Sabuncuoglu Tezcan | H01L 21/7682 257/774 |
| 2013/0062736 A1* | 3/2013 | Brighton | H01L 21/76898 257/621 |
| 2013/0299992 A1* | 11/2013 | Chang | H01L 21/6835 257/751 |

OTHER PUBLICATIONS

Thompson, Scott E. et al., "Uniaxial-Process-Induced Strained-Si: Extending the CMOS Roadmap," IEEE Transactions on Electron Devices, vol. 53, No. 5, May 2006; pp. 1010-1020.

\* cited by examiner

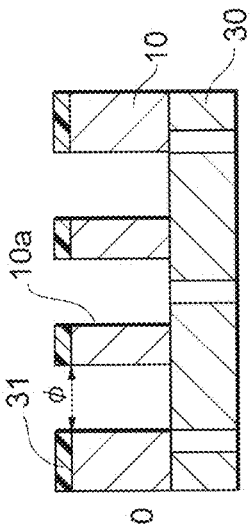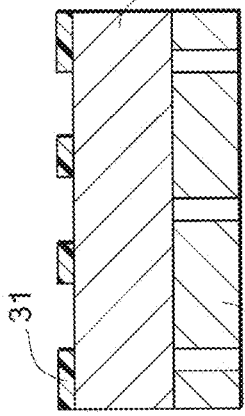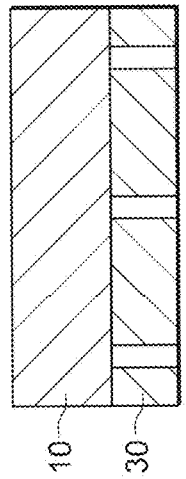
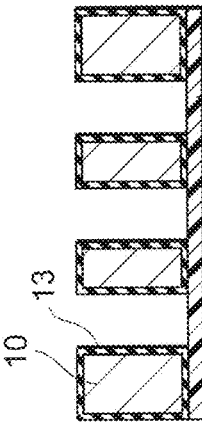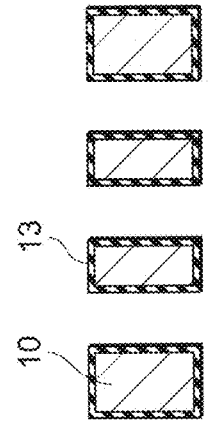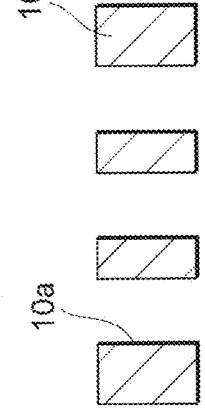
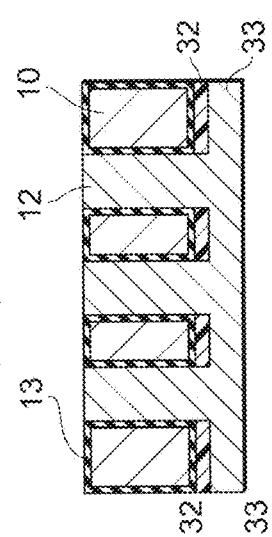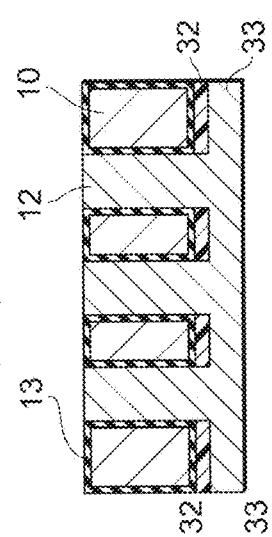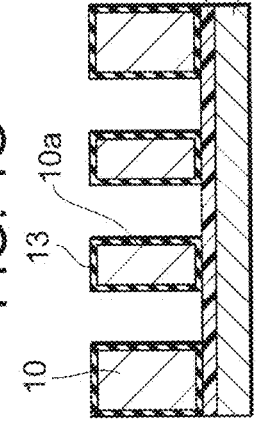

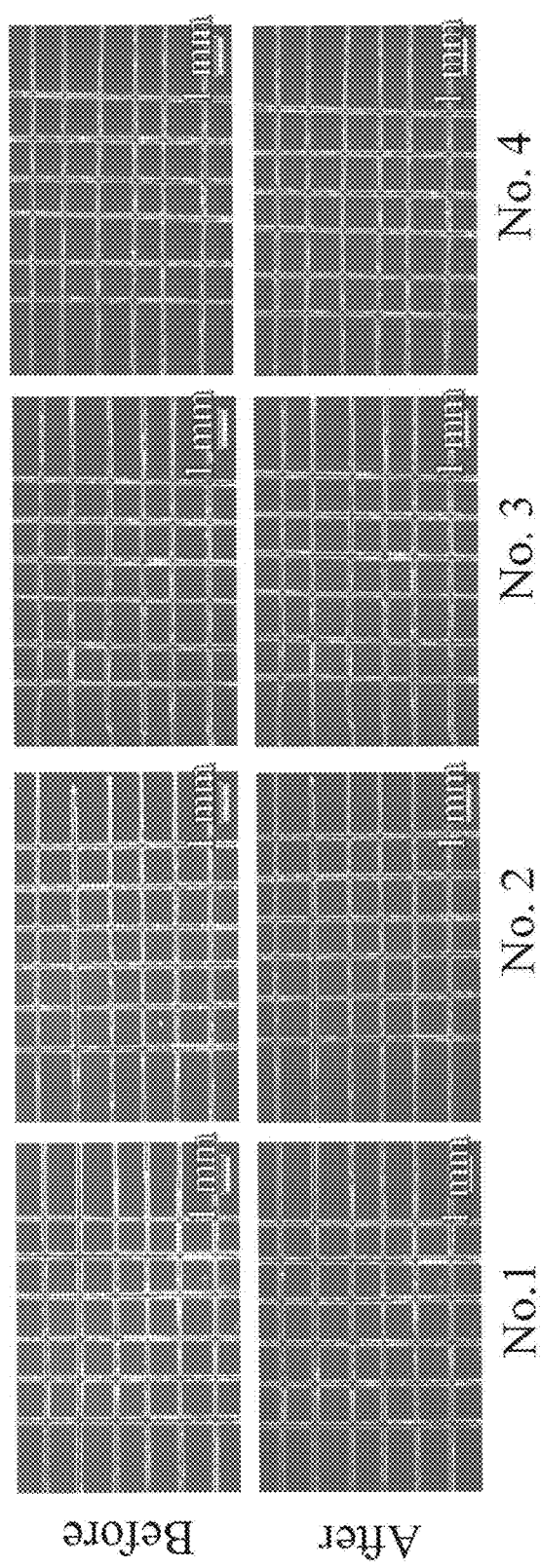

THROUGH ELECTRODE, MANUFACTURING METHOD THEREOF, AND SEMICONDUCTOR DEVICE AND MANUFACTURING METHOD THEREOF

CROSS REFERENCE TO RELATED APPLICATIONS

This application claims the benefit under 35 U.S.C. § 119(a) of Japanese Patent Application No. 2015-093196, filed on Apr. 30, 2015, the entire disclosure of which is incorporated herein by reference in its entirety.

BACKGROUND OF THE INVENTION

Field of the Invention

The present invention relates to a through electrode used in a three-dimensional integrated circuit and a manufacturing method thereof, and a semiconductor device and a manufacturing method thereof.

Background Art

Along with demands for more compact portable and wireless electronic devices, the development of finer and denser integrated circuits has been promoted to be used for micro-electronics in the next-generation. As a method to connect electronic devices mutually, three-dimensional packaging technology currently attracts attention. A through electrode, such as a through-silicon via (TSV), is one of the techniques to implement three-dimensional packaging, which is used to electrically connect devices that are three-dimensionally stacked, such as a logic, a memory, a sensor and an actuator.

Copper is a promising material for a conductive layer to make up a through electrode because of its low electric resistivity and high stress migration resistance. Meanwhile the use of a silicon oxide film as a side-wall insulating film has been examined so as to coat the side of a conductive layer of a through electrode (see Non-Patent Document 1, for example).

CITATION LIST

Non-Patent Document

[Non-Patent Document 1] S. E. Thompson, G. Sun, Y. S. Choi, and T. Nishida, "Uniaxial-process-induced strained-Si: extending the CMOS roadmap," IEEE Trans. Electron Devices, vol.53, no. 5, pp. 1010-1020, May 2006.

SUMMARY OF THE INVENTION

However when silicon oxide is used as a side-wall insulating film to coat the side of a conductive layer of a through electrode, high-temperature process is required to coat the inner wall of a through hole. A through electrode subjected to high-temperature process, however, has a problem of having poor thermomechanical reliability. This is because large stress is induced by thermal load due to a large difference in thermal expansion rate between copper making up the through electrode and a semiconductor substrate, such as silicon. Further, when a silicon oxide film is used, a barrier layer has to be provided to prevent diffusion of copper to a semiconductor substrate, such as silicon. High-temperature process performed to form such a barrier layer also becomes a factor for poor thermomechanical reliability.

In view of such background, an alternative insulating film has been demanded as a side-wall insulating film, instead of a silicon oxide film, and an organic low-dielectric constant material is considered theoretically as its candidate. If a side-wall insulating film made of an organic low-dielectric constant material can be formed at low-temperature process, the problem about thermomechanical reliability can be solved and capacitive coupling also can be suppressed, which therefore can suppress signal delay, power consumption and crosstalk and can improve the electrical characteristics.

However such a practically available organic low-dielectric constant material, which can achieve satisfactory mechanical reliability and electrical reliability of the through electrode and can eliminate a barrier layer, has not been found when the side-wall insulating film is formed at a low temperature, such as room temperature.

In view of such a circumstance, the present invention aims to provide a through electrode including an organic side-wall insulating film capable of eliminating a barrier layer and achieving satisfactory mechanical reliability and electrical reliability and a manufacturing method thereof, and a semiconductor device and a manufacturing method thereof.

According to the present invention, a through electrode disposed in a semiconductor substrate includes: a copper layer in the semiconductor substrate; and a side-wall insulating film that is disposed between the copper layer and the semiconductor substrate so as to be in contact with the copper layer and the semiconductor substrate, the side-wall insulating film being represented by the following chemical formula (1).

[Formula 1]

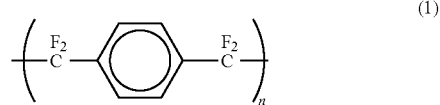

(1)

The present invention further relates to a semiconductor device including such a through electrode.

According to the present invention, a method for manufacturing a through electrode includes: forming a through hole in a semiconductor substrate; forming a side-wall insulating film represented by the following chemical formula (1) so as to coat an inner wall of the through hole; and forming a copper layer to fill the through hole and to be in contact with the side-wall insulating film.

[Formula 2]

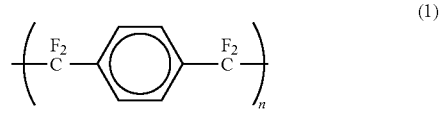

(1)

The present invention further relates to a method for manufacturing a semiconductor device, including the method for manufacturing a through electrode as stated above.

BRIEF DESCRIPTION OF THE DRAWINGS

FIGS. 4A-4I are cross-sectional views illustrating the steps of a manufacturing method of a through electrode as Example.

FIG. 6 illustrates observed images indicating the results of an adhesion test of the Parylene-HT film.

DESCRIPTION OF THE PREFERRED EMBODIMENTS

Figure 1:
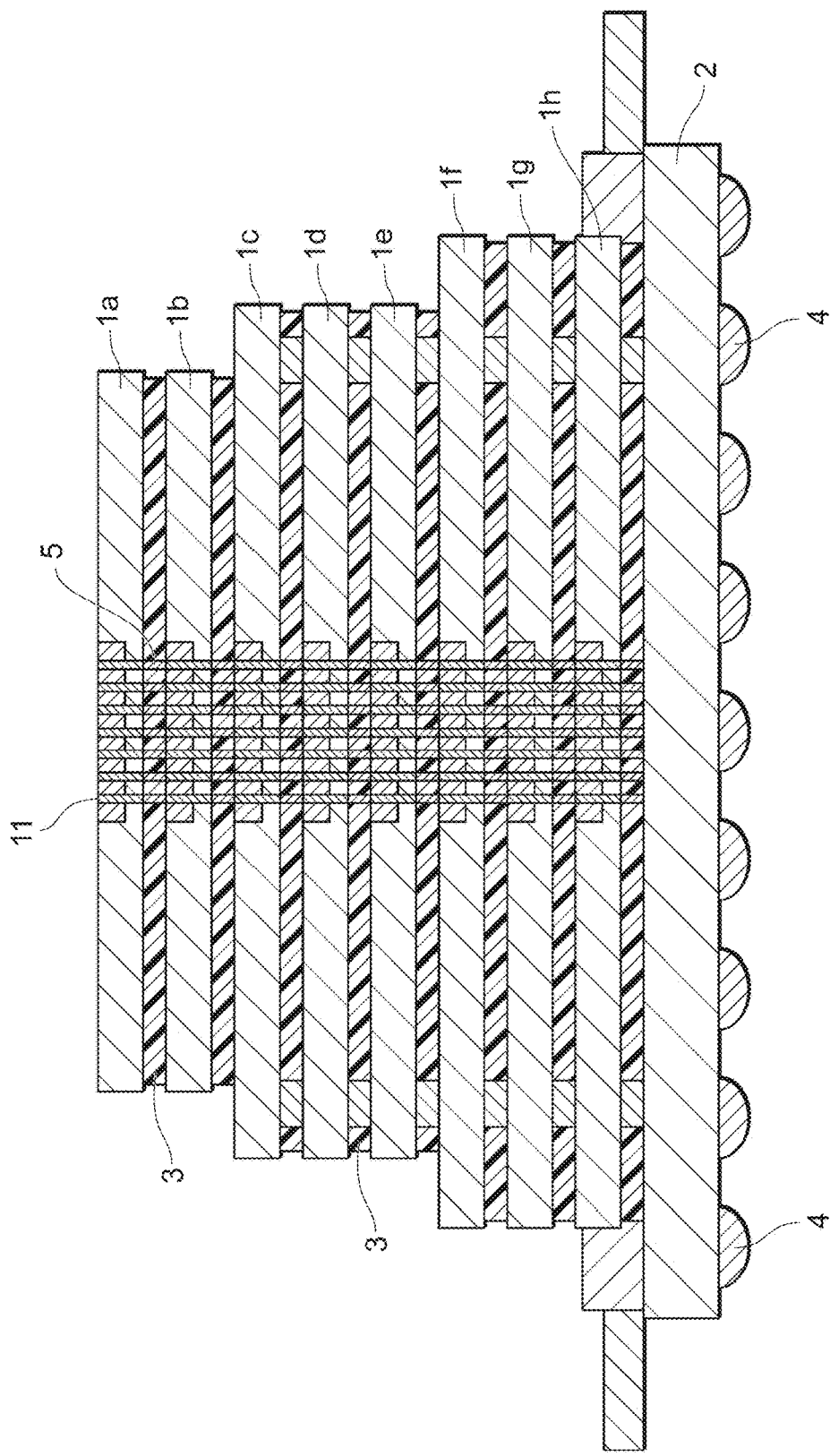
FIG. 1 is a cross-sectional view illustrating an exemplary schematic configuration of a three-dimensional stacked device, including a through electrode according to the present embodiment.

The following describes embodiments of the present invention in details. Referring now to the drawings, one embodiment of the present invention is described below. In the drawings, the same reference numerals are assigned to the same elements, and their duplicated descriptions are omitted. The positional relationship, such as above, below, left and right, in the descriptions is based on the positional relationship in the drawings unless otherwise specified. The dimensions and proportions in the drawings are not limited to those illustrated in the drawings. The following embodiment is just illustration to explain the present invention, which is not intended to limit the present invention to it. Further, the present invention is susceptible to various modifications without deviating from the gist thereof.

FIG. 1 is a cross-sectional view illustrating an exemplary schematic configuration of a three-dimensional stacked device, including a through electrode according to the present embodiment. The three-dimensional stacked device includes a plurality of semiconductor chips (semiconductor devices) 1a to 1h that are stacked on an interposer 2. Between the semiconductor chips 1, encapsulation resin 3 is disposed. Hereinafter when there is no need to distinguish the semiconductor chips 1a to 1h, they are called simply a semiconductor chip 1. Each semiconductor chip 1a to 1h includes a logic, a memory, a sensor, an actuator and the like. Each semiconductor chip 1a to 1h includes a plurality of through electrodes 11 that penetrates through the chip, so that the vertically-disposed semiconductor chips 1a to 1h are electrically connected. Between the through electrode 11 of one semiconductor chip 1 and the through electrode 11 of another semiconductor chip 1, a bump 5 is formed to electrically and mechanically connect these electrodes. Bumps 4 are formed on the interposer 2 as well. Materials of the bumps 4, 5 are not limited especially, which may include Au, Cu, Ag, Ni or the like as well as a solder material, such as Sn—Ag—Cu, Sn—Bi, Au—Sn, or Sn—Pb.

In the example of FIG. 1, the through electrodes 11 are densely formed at a center part of these semiconductor chips 1 so as to form an array of the through electrodes 11, which is not a limiting example. The through electrodes 11 may be formed at the periphery of the semiconductor chips.

Figure 2:
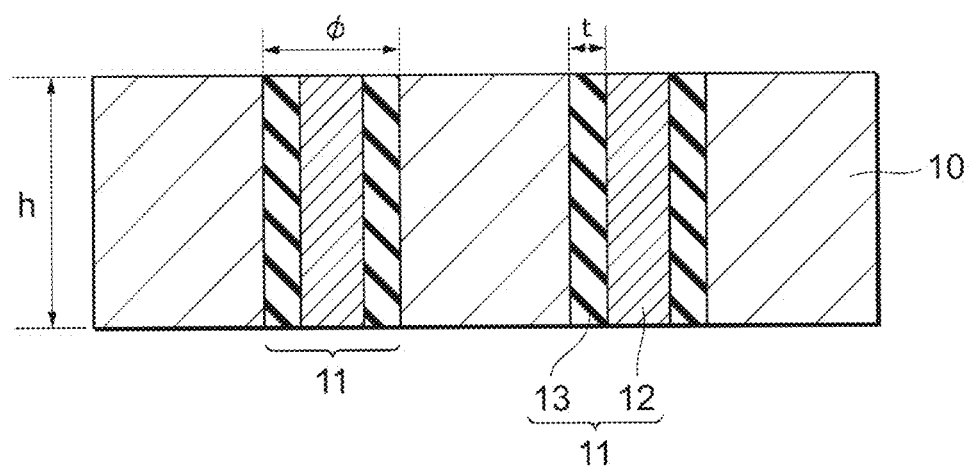
FIG. 2 is a cross-sectional view illustrating the configuration of a through electrode according to the present embodiment.

FIG. 2 is a cross-sectional view illustrating the details of an exemplary configuration of a through electrode 11 formed in the semiconductor chip 1. In the example of FIG. 2, the through electrode 11 that can be a through-silicon via (TSV) is formed in a semiconductor substrate 10. The through electrode 11 includes a copper layer 12 formed in the semiconductor substrate 10 and a Parylene-HT (registered trademark) film 13 that is a side-wall insulating film disposed between the copper layer 12 and the semiconductor substrate 10 so as to be in contact with the copper layer 12 and the semiconductor substrate 10, and that is represented by chemical formula (1).

[Formula 3]

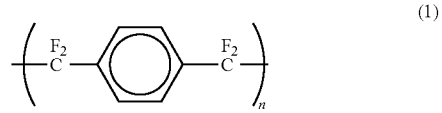

(1)

The semiconductor substrate 10 is a base material to form devices, such as a logic, a memory, a sensor and an actuator. The semiconductor substrate 10 is not limited to a Si substrate, which may be a semiconductor substrate made of GaAs, InP, SiC, GaN, CaTe or the like. The semiconductor substrate 10 may contain various impurities introduced.

The diameter φ of the through electrode 11 is not limited, which may be 2 µm to 25 µm, for example. The pitch of the through electrode is not limited, which may be set at double or more the diameter φ, for example. The through electrodes 11, which are to exchange signals between the plurality of semiconductor chips 1, may be formed densely, and in this case, the diameter and the pitch of the through electrodes 11 tend to be small. When the through electrode 11 is connected to a power supply, the diameter and the pitch of the through electrode 11 tend to be large. The height h of the through electrode 11 is not limited, which may be about 20 µm to 200 µm, for example.

The copper layer 12 makes up a primary conductive layer making up the through electrode 11. The thickness of the copper layer 12 in the planar direction of the semiconductor substrate, i.e., the diameter of the copper layer 12 may be 0.5 µm to 20 µm, for example.

The Parylene-HT film 13 is used as a side-wall insulating film to insulate the copper layer 12 of the through electrode 11 from the semiconductor substrate 10. The Parylene-HT film 13 serves as a barrier layer as well to prevent diffusion of copper from the copper layer 12 to the semiconductor substrate 10. The thickness t of the Parylene-HT film 13 in the planar direction of the semiconductor substrate is 0.3 μm to 1.0 μm, for example. Table 1 shows the characteristics of the Parylene-HT film 13.

TABLE 1

|  | Parylene-HT | Silicon oxide |
|---|---|---|
| Density (g/cm$^3$) | 1.32 | 2.2 |
| Young's modulus (GPa) | 2.55 | 69 |
| Melting point (° C.) | >500 | 1600 |
| Thermal expansion rate (ppm/° C.) | 36 | 0.5 |
| Dielectric constant | 2.17-2.21 | 3.9 |
| Resistivity (Ω · cm) | $2 \times 10^{17}$ | $1 \times 10^{14}$~$1 \times 10^{16}$ |
| Copper diffusion coefficient (cm$^2$/s) | $5.7 \times 10^{-18}$ (250° C.) $1.3 \times 10^{-16}$ (350° C.) | ~$1 \times 10^{-14}$ (250° C.) ~$1 \times 10^{-12}$ (350° C.) |

Since the through electrode 11 according to the present embodiment includes the Parylene-HT film 13 as the side-wall insulating film of the copper layer 12, the following advantageous effects can be obtained.

For instance, even when the Parylene-HT film 13 is formed at low temperatures, e.g., at room temperature (25° C.), enough adhesiveness of the Parylene-HT film 13 to the semiconductor substrate 10 can be achieved. Since the Parylene-HT film 13 can be formed at room temperature, stress to the semiconductor substrate 10 resulting from the through electrode 11 can be suppressed.

Further, since the Parylene-HT film 13 has lower Young's modulus than that of silicon oxide, such a film can function as a layer to release stress, and so the reliability of a semiconductor device formed in the semiconductor substrate can be improved.

Further, even when the Parylene-HT film 13 is formed at low temperatures, e.g., at room temperature, a through hole can be coated uniformly without pin holes, and so such a film can be used to form a through electrode 11 having a high aspect ratio.

Further, since the Parylene-HT film 13 has low dielectric constant, capacitive coupling can be reduced, and so signal delay and crosstalk between neighboring lines can be reduced.

Further, since the Parylene-HT film 13 has a lower coefficient of copper diffusion than that of silicon oxide and can suppress leak current, a barrier layer is not required. Therefore, stress to the semiconductor substrate 10 due to thermal process to form a barrier layer can be suppressed. This also can reduce the number of manufacturing steps, and so lead to cost reduction as well.

As stated above, since the present embodiment includes the Parylene-HT film 13 as a side-wall insulating film of the copper layer 12, the through electrode does not require a barrier layer and can have satisfactory mechanical reliability and electrical reliability.

Then, since a semiconductor device including the through electrode according to the present embodiment can solve the problem about thermomechanical reliability relating to the formation of a through electrode, the reliability of the device can be improved. Since the through electrodes can be disposed densely, a semiconductor device that is useful for three-dimensional packaging can be provided.

Referring now to FIGS. 3A-3F, the following describe one example of a method for manufacturing a through electrode according to the present embodiment. The present embodiment describes via-last scheme to form a semiconductor device in a semiconductor substrate, followed by the formation of a through electrode as one example, which may be via-first scheme, via-middle scheme, or via-after bonding scheme.

Figure 3A:
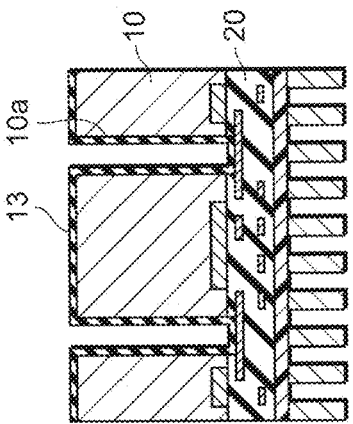
FIGS. 3A-3F are cross-sectional views illustrating the steps of an exemplary manufacturing method of a through electrode to manufacture a semiconductor device.

As illustrated in FIG. 3A, an element 15, such as a transistor not illustrated, is formed in a semiconductor substrate 10 made of silicon, for example, as well as a wiring layer 20 to form a circuit including the element such as a transistor. The wiring layer 20 includes lines 21 and an insulating layer 22. The semiconductor substrate 10 on the side of the wiring layer 20 is supported by a supporting substrate 30 via an adhesive layer 23, whereas the rear face side of the semiconductor substrate 10 without the wiring layer 20 is ground so as to make the semiconductor substrate 10 thinner.

Figure 3B:
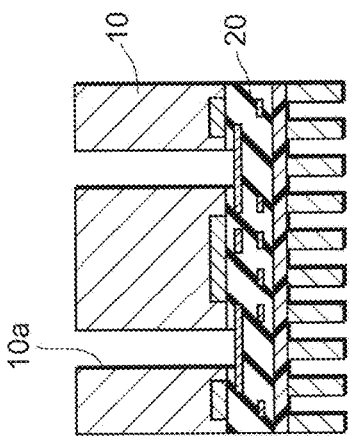

Next as illustrated in FIG. 3B, a resist pattern (not illustrated) is formed on the semiconductor substrate 10 by lithography, and then etching is performed using such a resist pattern as a mask to form a through hole 10a. The etching of the semiconductor substrate 10 is performed using Bosch process, for example. In the Bosch process, an etching step of performing isotropic etching mainly using sulfur hexafluoride (SF6) and a protection step of protecting the side wall using tetrafluoroethylene-based gas (such as C4F8) are repeated. Subsequently, the resist pattern is removed.

Figure 3C:
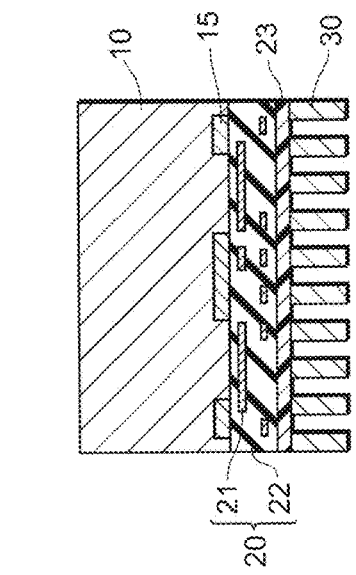

Next, as illustrated in FIG. 3C, a Parylene-HT film 13 is formed on the inner wall of the through hole 10a and on the semiconductor substrate 10. The Parylene-HT film 13 is a polymer membrane. The Parylene-HT film 13 is formed using dimer (di.poly.para-xylylene) in the powder form. For instance, dimer (di.poly.para-xylylene) is vaporized at 150° C. and with the pressure of 1.0 Torr, for example, to generate dimer gas, which is then thermal-decomposed at 680° C. and with the pressure of 0.5 Torr, for example, to be monomer gas. Then, this monomer gas is introduced to a semiconductor substrate placed in the room temperature atmosphere, specifically in the atmosphere at 25° C. and 0.1 Torr, so that poly(para-xylylene) as long-chain polymer is deposited on the semiconductor substrate 10. The principle of this deposition is that Parylene monomer becomes dense on the semiconductor substrate and is diffused, a chain of monomers starts to be formed and is propagated, and finally long-chain polymer is formed. Due to agglomeration prior to polymerization, the Parylene-HT film 13 that is a transparent, conformal and pinhole-free coating is formed on the entire semiconductor substrate. The thickness of the Parylene-HT film 13 is 1 μm, for example.

Figure 3D:
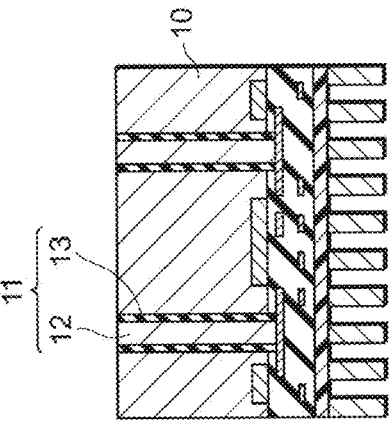

Next as illustrated in FIG. 3D, a part of the Parylene-HT film 13 deposited on the bottom of the through hole 10a is removed by anisotropic dry etching.

Figure 3E:
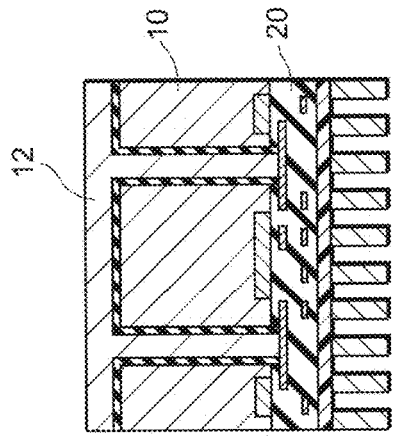

Next as illustrated in FIG. 3E, a seed layer of a copper layer 12 is formed on the inner wall of the through hole 10a and on the semiconductor substrate 10 by electroless plating, followed by deposition of copper on the seed layer by electroplating to form the copper layer 12. In the present embodiment, this formation step of the copper layer 12 also is preferably performed at room temperature.

Figure 3F:
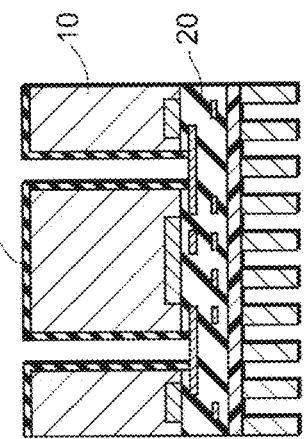

Next as illustrated in FIG. 3F, the copper layer 12 and the Parylene-HT film 13 deposited on the semiconductor substrate 10 are removed in this order by CMP. Thereby, a through electrode 11 including the copper layer 12 and the Parylene-HT film 13 is formed in the through hole 10a.

As stated above, the through electrode 11 including the copper layer 12 and the Parylene-HT film 13 and a semiconductor device including the through electrode are manufactured.

According to the method for manufacturing a through electrode according to the present embodiment, the Parylene-HT film 13 and the copper layer 12 are formed at room temperature. Thereby, stress to the semiconductor substrate 10 can be suppressed, and so a through electrode having good thermomechanical reliability can be manufactured.

According to the method for manufacturing a through electrode according to the present embodiment, stress to the semiconductor substrate generated due to the formation of the through electrode can be suppressed. Thereby, a reliable semiconductor device can be manufactured, in which variation in device characteristics due to stress can be suppressed.

The following describes the advantageous effects of the through electrode of the present embodiment, by way of the results of Examples.

(Manufacturing Method of Examples)

FIGS. 4A-4I are cross-sectional views illustrating the steps of a manufacturing method of a through electrode as one Example. As illustrated in FIG. 4A, a semiconductor substrate 10 made of silicon of 100 μm in thickness was supported by a supporting substrate 30. Next, a resist pattern 31 of 5 μm in thickness was formed on the semiconductor substrate 10 (FIG. 4B), and etching (Bosch process) was performed using the resist pattern 31 as a mask to form through holes 10a in the semiconductor substrate 10 (FIG. 4C). The diameter ϕ of the through holes 10a was 7, 12, 22, and 36 μm. Subsequently, the resist pattern 31 was removed, and the surface of the semiconductor substrate 10 was washed to improve adhesiveness of a Parylene-HT film 13 with the semiconductor substrate 10 (FIG. 4D). Next, the Parylene-HT film 13 of 1 μm in thickness was formed on the entire surface of the semiconductor substrate 10 including the inner wall of the through hole 10a by evaporation at room temperature (FIG. 4E). Next, a part of the Parylene-HT film 13 on the rear face side of the semiconductor substrate 10 was oxygen plasma-treated, a dry film 32 was stacked on the rear face side of the semiconductor substrate 10 (FIG. 4F), and a copper seed layer 33 of 15 μm in thickness was stacked on the dry film 32 (FIG. 4G). The oxygen plasma treatment was to improve adhesiveness of the dry film 32 with the Parylene-HT film 13. Next, a part of the Parylene-HT film 13 on the surface side of the semiconductor substrate 10 was reformed by oxygen plasma treatment, and then the dry film 32 exposed on the bottom of the through holes 10a was etched (FIG. 4H). The oxygen plasma treatment was to improve adhesiveness of copper with the Parylene-HT film 13. Next, copper was deposited at room temperature by electroplating (amount of current: 0.75 A) to form a copper layer 12 so as to fill the through holes 10a (FIG. 4I).

Figures 5A, 5B, 5C, 5D, 5E:
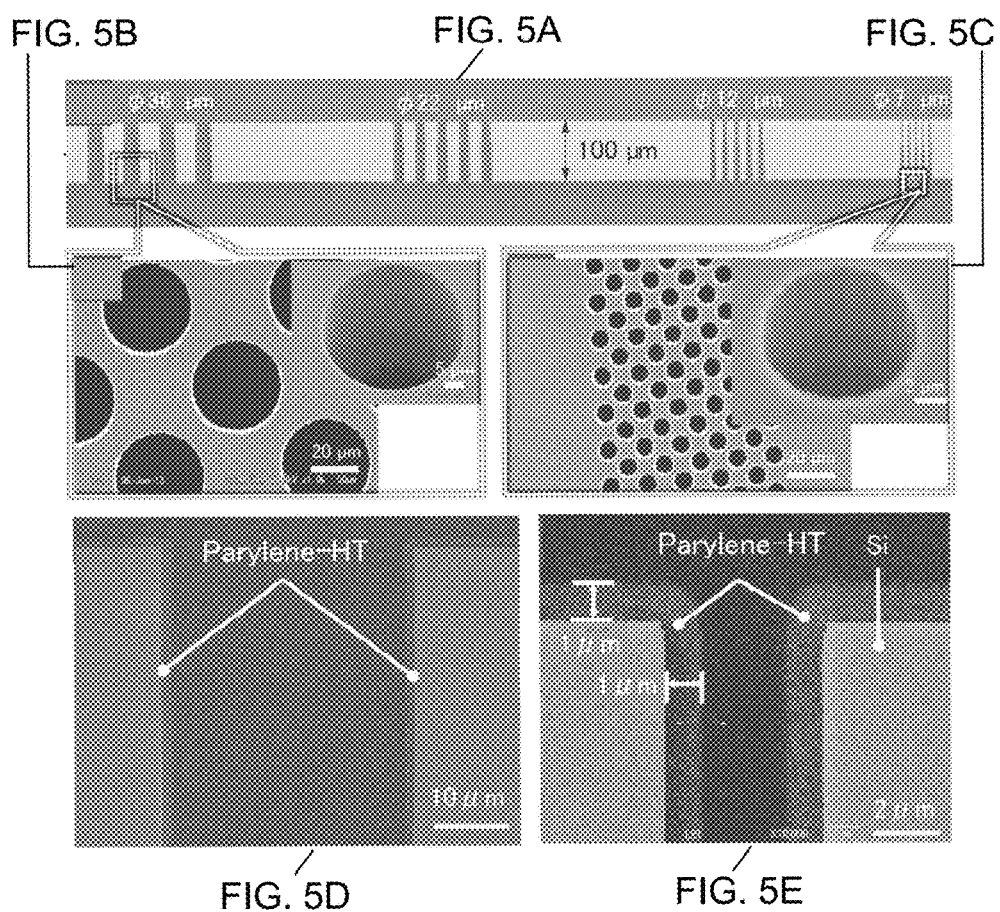
FIGS. 5A-5E include cross-sectional scanning electron microscope (SEM) images of a semiconductor substrate after the formation of the through holes.

FIG. 5A is a cross-sectional SEM image of the semiconductor substrate 10 after the formation of the through holes 10a illustrated in FIG. 4D, and FIG. 5B and FIG. 5C are magnified SEM images of parts of FIG. 5A. FIG. 5D is a cross-sectional SEM image after the formation of the Parylene-HT film 13, and FIG. 5E is a magnified SEM of FIG. 5D. As illustrated in FIG. 5D and FIG. 5E, it is found that the pinhole-free and uniform Parylene-HT film 13 was formed on the semiconductor substrate 10 including the through holes 10a. In this way, when the Parylene-HT film 13 is formed at low temperatures, e.g., at room temperature as well, pinhole-free and uniform coating of the through holes is enabled, which can be used to form a through electrode 11 of a high aspect ratio as well.

FIG. 6 illustrates the results of an adhesion test of the Parylene-HT film 13 to the semiconductor substrate 10. The adhesion test was performed according to ISO2409/JIS K5600. Specifically, cross-cutting was performed on the Parylene-HT film 13 at the intervals of 1 mm, and a tape was attached to the Parylene-HT film 13. Then, this tape was peeled off with the angle of 90°. FIG. 6 illustrates images of four samples before attaching the tape (Before) and after peeling off the tape (After). As illustrated in FIG. 6, peeling-off of the Parylene-HT film 13 did not occur in any sample. This adhesion test shows that adhesiveness of the Parylene-HT film 13 to the silicon semiconductor substrate was high, which satisfied mechanical reliability.

Figure 7:
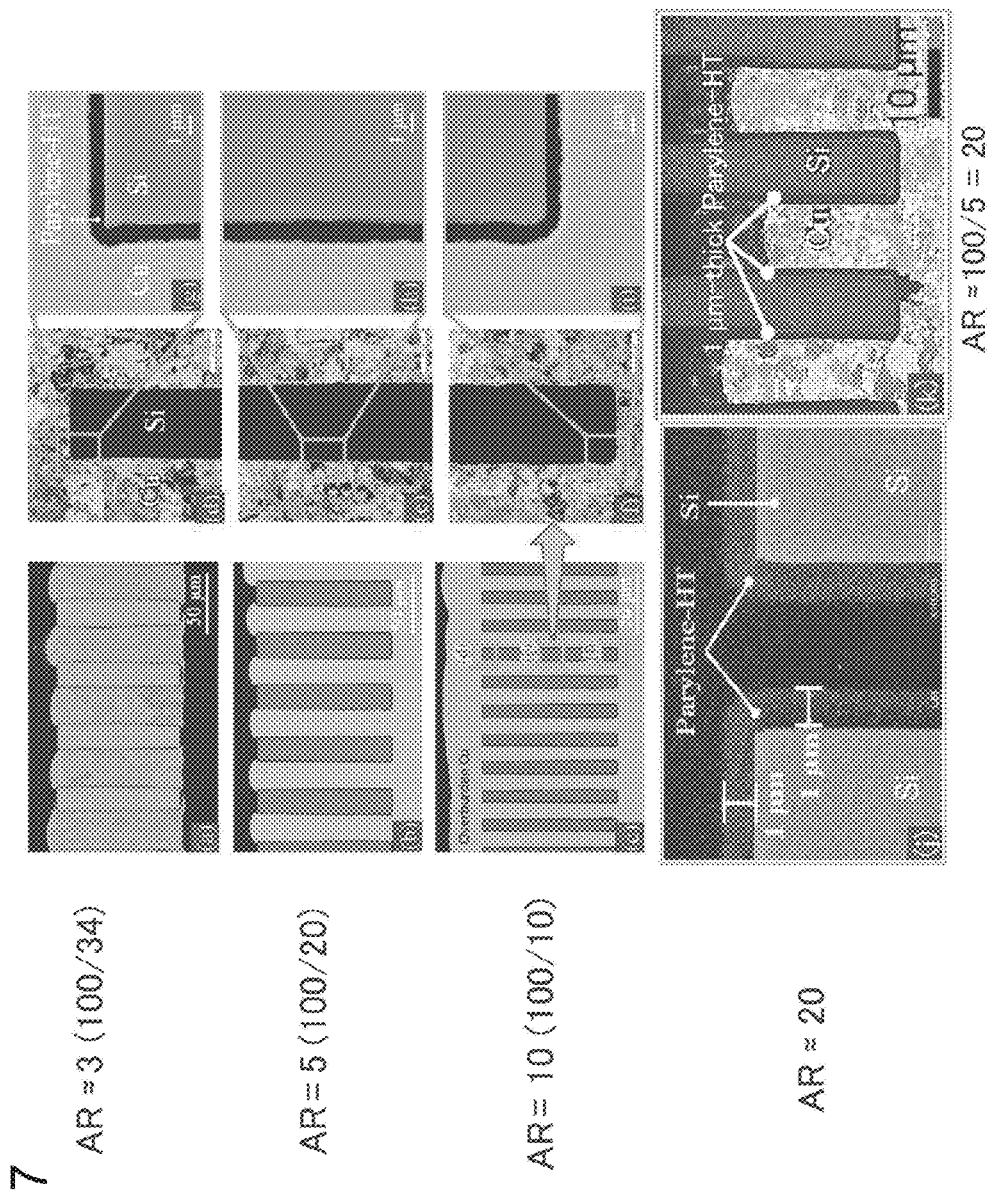
FIG. 7 illustrates observed images indicating fillability of copper layer into through holes having various aspect ratios (AR) coated with the Parylene-HT film.

FIG. 7 are images indicating the fillability of the copper layer 12 into through holes having various aspect ratios (AR) that are coated with the Parylene-HT film. FIG. 7A is a cross-sectional SEM image after filling with copper layer of a through hole having an aspect ratio of 3, FIG. 7B is such an image of a through hole having an aspect ratio of 5, and FIG. 7C is such an image of a through hole having an aspect ratio of 10. FIGS. 7D to F are magnified images of parts of FIG. 7C. FIGS. 7G to I are magnified images of part of FIGS. 7D to F, respectively. FIG. 7K is a cross-sectional SEM image after filling with copper layer of a through hole 10a having an aspect ratio of 20, and FIG. 7J is a magnified image of a part of FIG. 7K. As illustrated in FIG. 7, it was confirmed that fillability with copper was good for any of the through holes having aspect ratios of 3 to 20 coated with the Parylene-HT film 13. Further no cracks or voids of the copper layer were found in any of the through electrodes.

Figure 8:
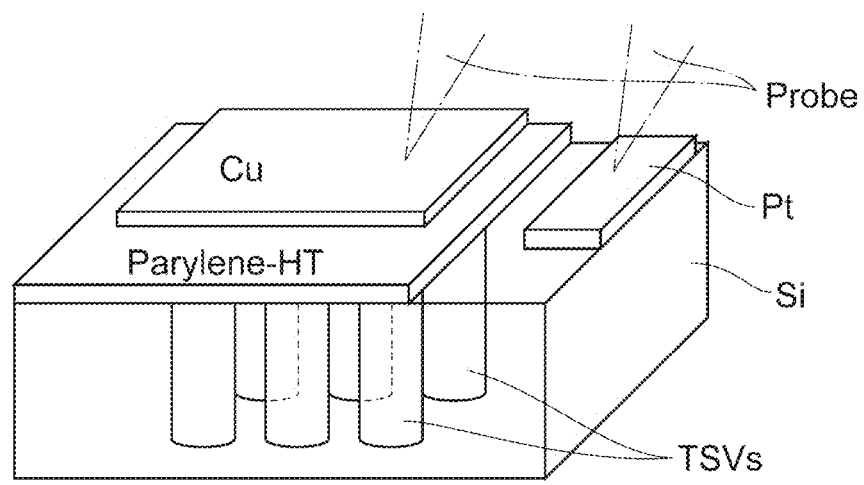
FIG. 8 illustrates a method for measuring leak current and capacity at the Parylene-HT film included in the through electrode.

FIG. 8 illustrates a method for measuring leak current and capacity at the Parylene-HT film 13 of the through electrode 11. As illustrated in FIG. 8, a plurality of through electrodes (TSVs) were formed in a semiconductor substrate (Si) made of silicon. The plurality of through electrodes were formed because only one through electrode has small capacity and small leak current, which are beyond the measurement limit. The plurality of through electrodes were connected in parallel. On the semiconductor substrate 10 in which the plurality of through electrodes were formed, a copper layer was formed via the Parylene-HT film. On another part of the semiconductor substrate 10, a platinum layer (Pt) of 200 nm in thickness was formed. Probes were brought into contact with the copper layer and the platinum layer to measure current flowing between the probes, whereby the capacity and the leak current of the through electrodes were measured.

Figure 9:
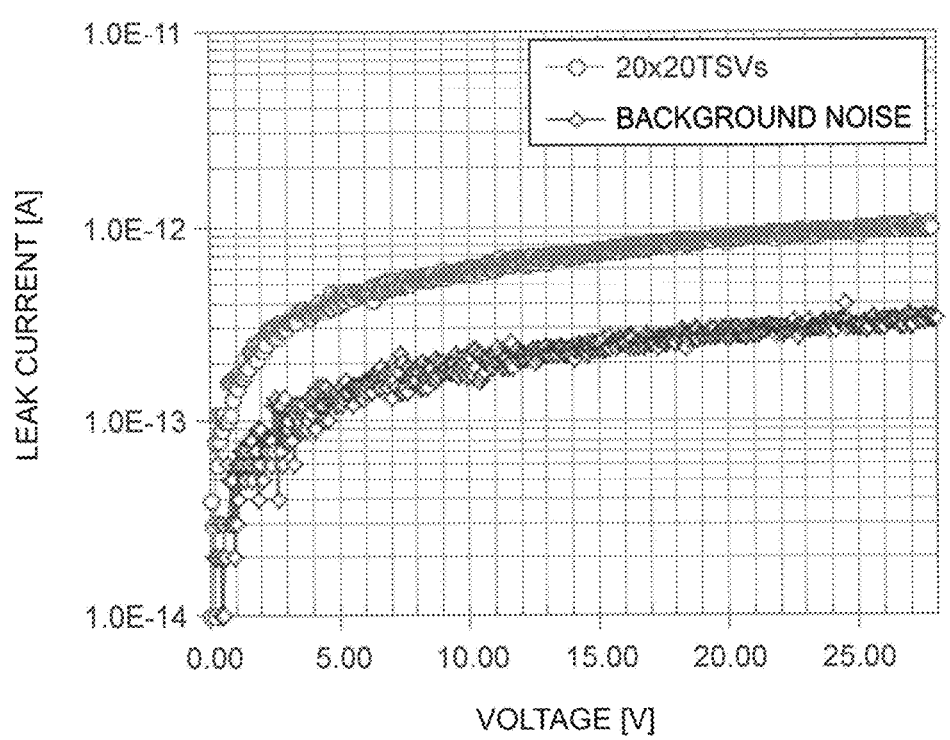
FIG. 9 illustrates the measurement result of leak current from the Parylene-HT film in the array of through electrodes.

FIG. 9 illustrates the result of leak current from the Parylene-HT film in the array of through electrodes that was measured by the measurement method of FIG. 8. In this measurement, leak current was measured in the array of through electrodes of 20×20, i.e., 400 through electrodes in total via the Parylene-HT film. As illustrated in FIG. 9, a very small value of leak current of 1×10-12 A from the 400 through electrodes was found at the voltage from 0 to 25 V. This results shows that the Parylene-HT film had excellent insulating property.

Figure 10:
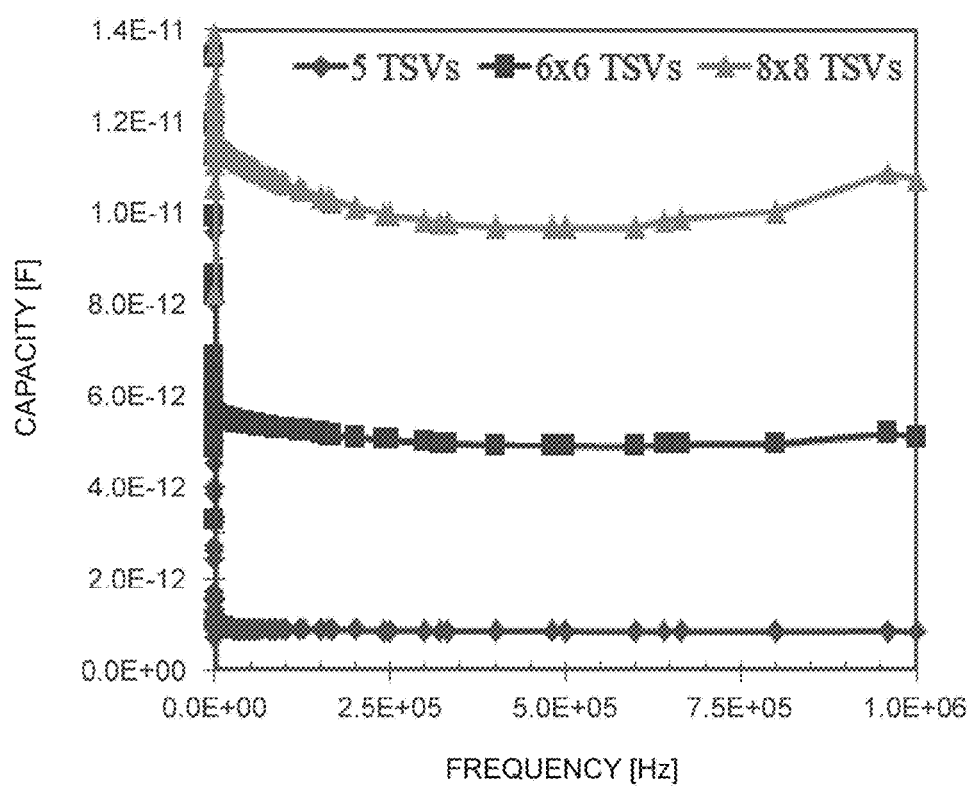
FIG. 10 illustrates the measurement result of frequency versus capacity of the Parylene-HT film in the arrays of through electrodes.
Figure 11:
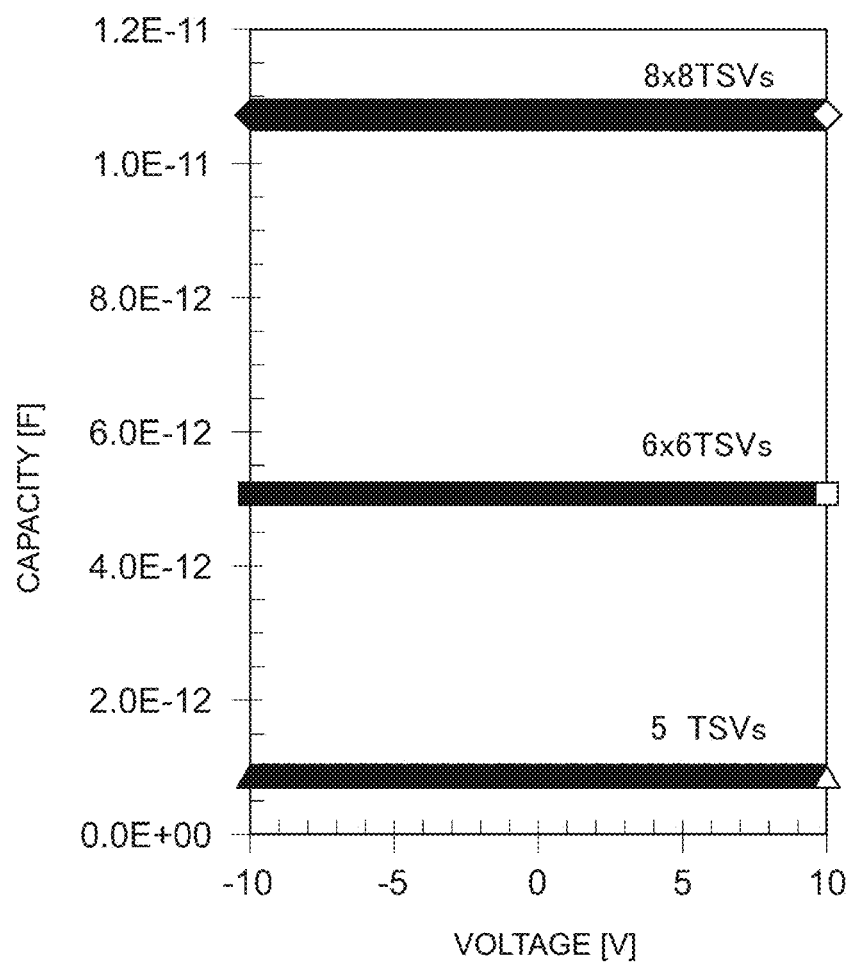
FIG. 11 illustrates the measurement result of voltage versus capacity of the Parylene-HT film in the arrays of through electrodes.

FIG. 10 and FIG. 11 illustrate the measurement results of the capacity of the Parylene-HT film in different arrays of through electrodes that was measured by the test method of FIG. 8. In this measurement, the capacity of the Parylene-HT film in the five through electrodes, in the array of 6×6 (36 in total) through electrodes and in the array of 8×8 (64 in total) through electrodes was measured. The capacity was measured while changing frequency and voltage. FIG. 10 illustrates the measurement result of capacity versus frequencies, and FIG. 11 illustrates the measurement result of capacity versus voltages. As illustrated in FIG. 11, it was confirmed that the capacity of the Parylene-HT film did not depend on voltage.

Figure 12:
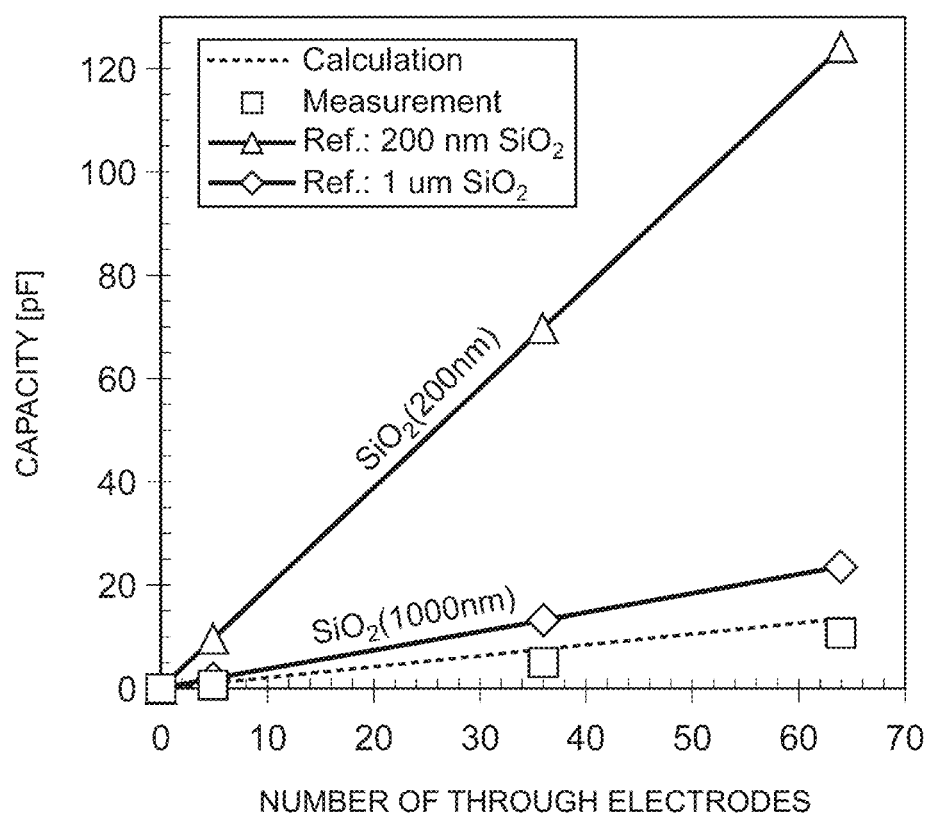
FIG. 12 illustrates the capacity of the Parylene-HT film when the number of through electrodes was changed.

FIG. 12 illustrates the capacity of the Parylene-HT film when the number of through electrodes was changed that was measured by the test method of FIG. 8. "Measurement" in FIG. 12 indicates the capacity measurements of the Parylene-HT film, and "Calculation" indicates the calculated values of the capacity of the Parylene-HT film. FIG. 12 illustrates the capacity measurements of silicon oxide films of 200 nm and 1,000 nm in thickness that were measured under the same condition. As illustrated in FIG. 12, it was found that the capacity measurements of the Parylene-HT film followed the calculated values well. It was further found that the capacity of the Parylene-HT film was much lower than that of the silicon oxide film. The difference in capacity between the Parylene-HT film and the silicon oxide film increased with the number of the through electrodes. This shows that the Parylene-HT film used as the insulating film of the through electrodes can reduce capacitive coupling and can reduce signal delay, power consumption and crosstalk between neighboring lines.

Figures 13A, 13B, 13C:
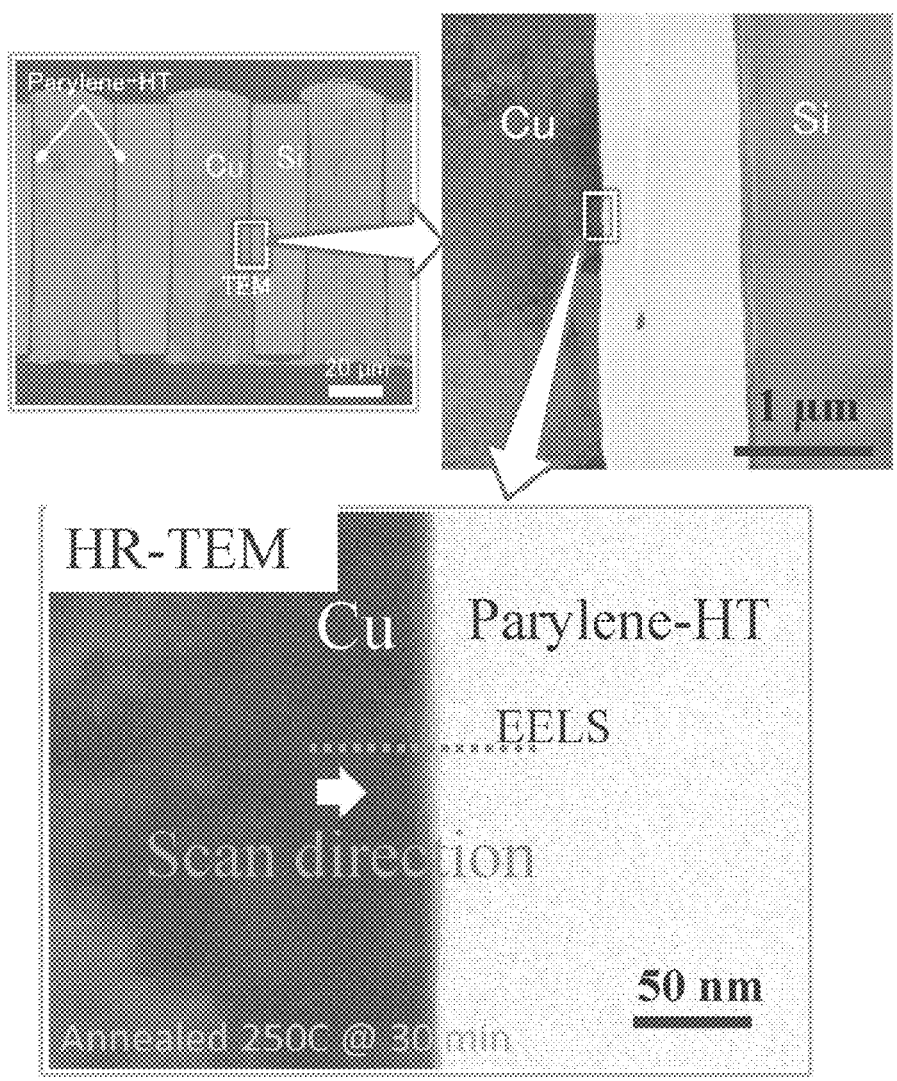
FIGS. 13A-13C illustrate a high-resolution transmission electron microscope (TEM) image of the interface between the copper layer and the Parylene-HT film.
Figure 14:
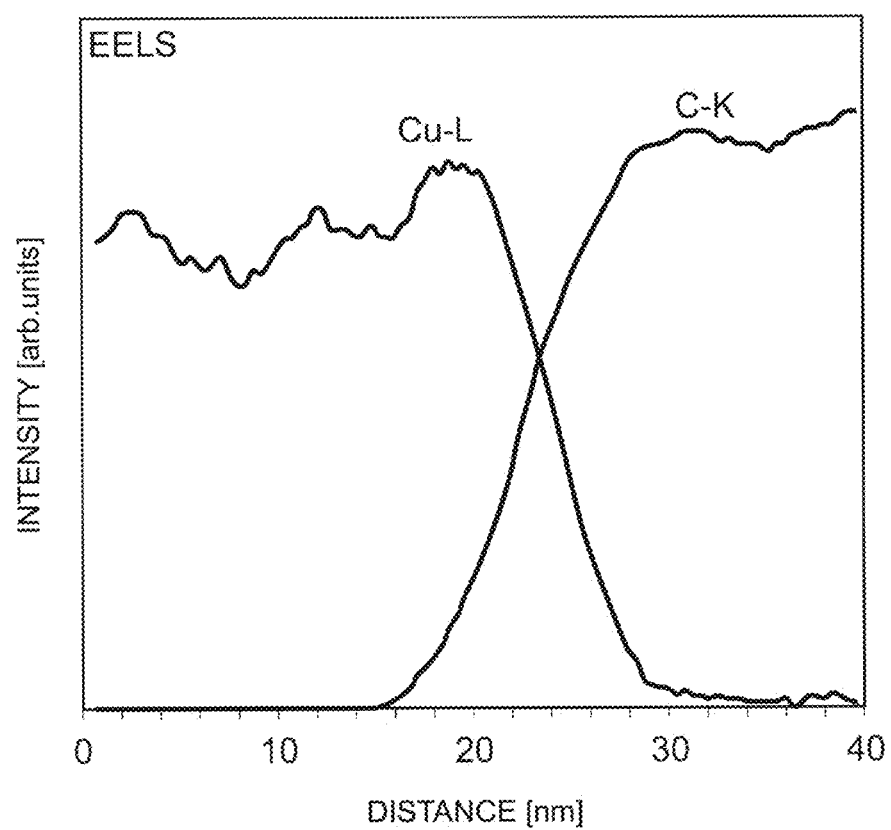
FIG. 14 illustrates the result of electron energy-loss spectroscopy (EELS) measurement at the interface between the copper layer and the Parylene-HT film.

FIGS. 13A-13C illustrate a high-resolution TEM image of the interface between the copper layer and the Parylene-HT film, where FIG. 13A is the overall image, FIG. 13B is a magnified image of a part of FIG. 13A, and FIG. 13C is a magnified image of a part of FIG. 13B. FIG. 14 illustrates the result of EELS measurement at the interface between the copper layer and the Parylene-HT film in FIG. 13C. The EELS measurement was performed after annealing of the through electrodes of FIG. 13 at 250° C. for 30 minutes.

In FIG. 14, the region where Cu was detected with high intensity was a region of the copper layer, and the region where C was detected with high intensity was a region of the Parylene-HT film. As illustrated in FIG. 14, it was confirmed that the diffusion depth of copper into the Parylene-HT film was 10 nm or less. As a result, it was confirmed that the Parylene-HT film 13 has copper barrier performance, and so no separate barrier layer is required.

As stated above, the present invention is susceptible to various modifications without deviating from the gist thereof. The through electrodes as the above Examples were described to explain the advantageous effects of the present embodiment, and the present embodiment is not limited to specific conditions (materials and film thicknesses) to manufacture the through electrodes of the above Examples.

What is claimed is:

1. A through electrode disposed in a semiconductor substrate, comprising:
   a copper layer in the semiconductor substrate; and
   a side-wall insulating film that is disposed between the copper layer and the semiconductor substrate so as to be in direct contact with the copper layer and in contact with the semiconductor substrate, the side-wall insulating film having a thickness equal to or more than 0.3 µm, the side-wall insulating film being represented by the following chemical formula (1)

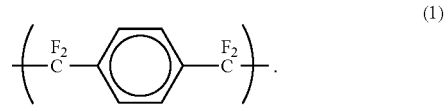

2. The through electrode according to claim 1, wherein the semiconductor substrate includes silicon.

3. A semiconductor device comprising the through electrode according to claim 2.

4. A semiconductor device comprising the through electrode according to claim 1.

5. A method for manufacturing a through electrode, comprising:
   forming a through hole in a semiconductor substrate;
   forming a side-wall insulating film represented by the following chemical formula (1) so as to coat an inner wall of the through hole; and
   forming a copper layer to fill the through hole and to be in direct contact with the side-wall insulating film

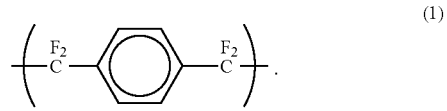

6. The method for manufacturing a through electrode according to claim 5, wherein in the step of forming the side-wall insulating film, the side-wall insulating film is formed by CVD at room temperature.

7. The method for manufacturing a through electrode according to claim 6, wherein in the step of forming the copper layer, the copper layer is formed by plating at room temperature.

8. A method for manufacturing a semiconductor device, comprising the method for manufacturing a through electrode according to claim 6.

9. The method for manufacturing a through electrode according to claim 5, wherein in the step of forming the copper layer, the copper layer is formed by plating at room temperature.

10. A method for manufacturing a semiconductor device, comprising the method for manufacturing a through electrode according to claim 9.

11. A method for manufacturing a semiconductor device, comprising the method for manufacturing a through electrode according to claim 5.

* * * * *